United States Patent
Rickers et al.

(10) Patent No.: US 9,231,212 B2
(45) Date of Patent: Jan. 5, 2016

(54) FABRICATION APPARATUS FOR FABRICATING A LAYER STRUCTURE

(75) Inventors: Christoph Rickers, Aachen (DE); Pieter Gijsbertus Maria Kruijt, Eindhoven (NL)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/117,443

(22) PCT Filed: May 15, 2012

(86) PCT No.: PCT/IB2012/052412
§ 371 (c)(1),
(2), (4) Date: Nov. 13, 2013

(87) PCT Pub. No.: WO2012/160475
PCT Pub. Date: Nov. 29, 2012

(65) Prior Publication Data
US 2014/0272326 A1    Sep. 18, 2014

(30) Foreign Application Priority Data
May 23, 2011  (EP) .................................... 11167068

(51) Int. Cl.
*B32B 3/00* (2006.01)
*H01L 51/00* (2006.01)
*H01L 51/56* (2006.01)
*B23K 26/36* (2014.01)

(52) U.S. Cl.
CPC .......... *H01L 51/0017* (2013.01); *B23K 26/365* (2013.01); *H01L 51/56* (2013.01); *Y10T 428/24802* (2015.01)

(58) Field of Classification Search
CPC ............ H01L 51/0014; H01L 51/0017; Y10T 428/24802
See application file for complete search history.

(56) References Cited

U.S. PATENT DOCUMENTS

| 2005/0136622 | A1 | 6/2005 | Mulligan et al. |
| 2006/0163744 | A1 | 7/2006 | Vanheusden et al. |
| 2006/0189113 | A1 | 8/2006 | Vanheusden et al. |
| 2008/0176398 | A1* | 7/2008 | Jain ..................... H01L 21/0272 438/674 |
| 2010/0079062 | A1* | 4/2010 | Michels et al. ............... 313/504 |
| 2014/0203250 | A1* | 7/2014 | Rickers et al. .................. 257/40 |

FOREIGN PATENT DOCUMENTS

WO    2005101505  A2    10/2005

OTHER PUBLICATIONS

D.S. Shin et al; "Elimination of Surface Debris Generated by KrF Excimer Laser Ablation of Polyimide", Materials Science and Engineering A: Structural Materials: Properties, Microstructure & Processing, Lausanne, CH, vol. 416, No. 1-2, Jan. 25, 2006, pp. 205-210, XP027952001.

* cited by examiner

*Primary Examiner* — Elizabeth Mulvaney
(74) *Attorney, Agent, or Firm* — Yuliya R. Mathis

(57) ABSTRACT

The invention relates to a fabrication apparatus for fabricating a layer structure comprising at least a patterned first layer on a substrate. A layer structure (6) with an unpatterned first layer is provided on the substrate. A protective material application unit (8) applies protective material at least on parts of the provided layer structure for protecting at least the parts of the provided layer structure (6), an ablation unit (12) ablates the unpatterned first layer through the protective material such that the patterned first layer is generated, and the protective material removing unit (15) removes the protective material (9). This allows fabricating a layer structure for, for example, an OLED without necessarily using a technically complex and costly photolithography process. Moreover, ablation debris can be removed with removing the protective material, thereby reducing the probability of unwanted effects like unwanted shortcuts in the OLED caused by unwanted debris.

14 Claims, 5 Drawing Sheets

FABRICATION APPARATUS FOR FABRICATING A LAYER STRUCTURE

FIELD OF THE INVENTION

The invention relates to a fabrication apparatus, a fabrication method and a fabrication computer program for fabricating a layer structure. The invention relates further to an electrical device like an organic light-emitting diode (OLED) comprising the layer structure.

BACKGROUND OF THE INVENTION

A layer structure for an OLED generally comprises a patterned anode and a cathode, wherein organic layers are sandwiched between the patterned anode and the cathode. The anode is patterned by using photolithography. This makes the layer structures, especially for small product series, an expensive component, because photolithography has been developed for very high accuracy and fine pattern resolution which makes it an expensive process.

SUMMARY OF THE INVENTION

It is an object of the present invention to provide a fabrication apparatus, a fabrication method and a fabrication computer program for fabricating a layer structure, wherein a layer of the layer structure can be patterned without using the costly photolithography process. It is a further object of the present invention to provide an electrical device like an OLED comprising the fabricated layer structure.

In a first aspect of the present invention a fabrication apparatus for fabricating a layer structure comprising at least a patterned first layer on a substrate is presented, wherein a layer structure with an unpatterned first layer is provided on the substrate, wherein the fabrication apparatus comprises:
- a protective material application unit for applying protective material at least on parts of the provided layer structure for protecting at least the parts of the provided layer structure,
- an ablation unit for ablating the unpatterned first layer through the protective material such that the patterned first layer is generated,
- a protective material removing unit for removing the protective material.

Since the first layer is patterned by ablating the unpatterned first layer, the first layer is not patterned by using the costly photolithography process. Moreover, since the ablation unit ablates the first layer through the protective material, while the protective material protects at least parts of the layer structure, debris, which may be produced by ablating the first layer through the layer structure, does not adversely affect the protected parts of the layer structure. Since unwanted debris will not be located on the protected parts of the layer structure, unwanted effects like unwanted shortcuts which could be caused by the debris can be avoided, thereby improving the quality of the layer structure.

The substrate is preferentially glass, in particular, a glass plate. For example, the substrate is a soda lime glass plate provided with a conductive transparent coated layer like indium tin oxide (ITO), wherein the transparent conductive layer is preferentially the first layer.

Preferentially, the provided layer structure further comprises an unpatterned second layer, wherein the unpatterned first layer is located between the substrate and the unpatterned second layer and wherein the fabrication apparatus further comprises an etch mask application unit for applying a patterned etch mask on the unpatterned second layer after the protective material has been applied, and an etching unit for etching the unpatterned second layer for forming the patterned second layer.

The second layer comprises preferentially a metallization made from MoNb/AlNd/MoNb coatings. Alternatively or in addition, the second layer can also comprise another metallization including, for example, CrAlCr and/or Cu alloys.

Preferentially, the unpatterned second layer is to be patterned to comprise second layer material in first regions and not in second regions on the substrate, wherein the protective material application unit is adapted to apply a patterned protective layer on the unpatterned second layer such that protective material is located in the second regions. It is further preferred that the etch mask application unit is adapted to apply the etch mask on the unpatterned second layer such that etch mask material is located in the first regions. Thus, if the application of the etch mask by, for example, inkjet printing or other printing techniques is not perfect, parts of the etch mask, in particular, droplets of the corresponding ink which may form the etch mask, may be spread on the protective material and will later be removed with removing the protective material. If the etch mask material located in unwanted regions would not be removed by removing the protective material, unwanted (second layer) material islands would be created, because at the locations at which the etch mask material has been spread, the second layer does not get etched. Since the second layer is preferentially a metal layer, the material islands would be a metal islands, which may cause shortcuts. Since these unwanted shortcuts can be avoided, the quality of the layer structure can be further improved.

In a preferred embodiment, the protective material application unit is adapted to apply the protective material by printing. Printing has the advantage of being less costly in comparison to photolithography and can provide fast switching times from one design to another. It is also preferred that the protective material application unit is adapted to apply a wax as the protective material. A wax is preferentially used which becomes liquid at a temperature of about 90° C. The wax is preferentially a printable wax ink.

It is further preferred that the etch mask application unit is adapted to print the etch mask on the unpatterned second layer. The etch mask application unit is preferentially further adapted to soft bake the etch mask.

In an embodiment, the ablation unit comprises a laser for performing a laser ablation through the unpatterned second layer. Also laser ablation is less costly than photolithography and can provide fast switching times from one design to another. In an embodiment, the laser is a solid state laser operating at 355 nm having a Q-switch mode for equal pulse energy. The beam profile can be Gauss-shaped. However, the beam profile can also have another shape. For example, the beam profile can be a flat top profile. The ablation of the first layer is preferentially performed after the etch mask has been applied. In another embodiment, the ablation unit can also be adapted to perform a laser ablation through the substrate, i.e. from the other side of the layer structure.

It is also preferred that the protective material removing unit is adapted to use heated water for removing the protective material. Thus, the protective material can be removed in a relatively simple way by just using heated water. Preferentially, the protective material, which is preferentially a printable wax, is removed by using water which is heated to or above a temperature at which the protective material becomes liquid. The water is preferentially distilled water. It can be provided as liquid and/or as steam, in particular, as superheated steam. The water can be heated to a temperature of about 95° C. at which temperature the wax may be liquid. The removing procedure can be performed by spray-stripping or another stripping technique. The protective material removing unit can further be adapted to heat the layer structure, in particular, the substrate, to a temperature, at which the protective material evaporates and the etch mask is not hard baked. The evaporation may remove monolayers of the protective material, which may still be present after a removing procedure has been performed by using heated water only. Thus, in an embodiment, the protective material removing unit can be adapted to remove the protective material by using heated water and by heating the layer structure to an evaporation temperature of the protective material.

In a preferred embodiment, the fabrication apparatus further comprises an etch mask removing unit for removing the etch mask, after the second layer has been etched.

It is further preferred that the fabrication apparatus comprises an insulating material application unit for applying insulating material on the layer structure, in particular after the etch mask has been removed. Preferentially, the insulating material is supplied to edges of the patterned second layer and connected to both, the second and the first layer. The insulating material application unit is preferentially adapted to apply the insulating material by inkjet printing. The insulating material is preferentially a resist.

In an embodiment, the fabrication apparatus further comprises an electrical device producing unit for producing an electrical device comprising the layer structure with at least the patterned first layer. For example, the electrical device producing unit can be adapted to apply organic material on the layer structure, and then on a part of the layer structure and on the organic material a conductive layer for providing a cathode, wherein the cathode and the first and second patterned layer forming an anode can be electrically connected to a voltage source, in order to apply voltage to the organic material, which then emits light. The produced electrical device is therefore preferably an OLED. The electrical device producing unit can further be adapted to provide a casing and a getter for protecting the organic layer against moisture.

The electrical device producing unit can also be adapted to produce another electrical device, not being an OLED. For example, the electrical device producing unit can be adapted to produce a photovoltaic cell comprising an organic or inorganic coating with a cathode on the layer structure.

In a further aspect of the present invention an electrical device comprising a layer structure including at least a patterned first layer on a substrate is presented, wherein the layer structure is fabricatable by the fabrication apparatus as defined in claim 1. In particular, an electrical device is presented comprising a layer structure including at least a first patterned layer and a second patterned layer on a substrate, wherein the first patterned layer is located between the substrate and the second patterned layer and wherein the layer structure is fabricatable by the fabrication apparatus as defined in claim 1. The electrical device is preferably an OLED.

In a further aspect of the present invention a fabrication method for fabricating a layer structure comprising at least a patterned first layer on a substrate is presented, wherein a layer structure with an unpatterned first layer is provided on the substrate, wherein the fabrication method comprises:
  applying protective material at least on parts of the provided layer structure,
  ablating the unpatterned first layer through the protective material such that the first patterned layer is generated,
  removing the protective material.

In a further aspect of the present invention a fabrication computer program for fabricating a layer structure comprising a patterned first layer on a substrate is presented, the computer program comprising program code means for causing a fabrication apparatus as defined in claim 1 to carry out the steps of the fabrication method as defined in claim 14, when the computer program is run on a computer controlling the fabrication apparatus.

It shall be understood that the fabrication apparatus of claim 1, the electrical device of claim 13, the fabrication method of claim 14 and the fabrication computer program of claim 15 have similar and/or identical preferred embodiments as defined in the dependent claims.

It shall be understood that a preferred embodiment of the invention can also be any combination of the dependent claims with the respective independent claim.

These and other aspects of the invention will be apparent from and elucidated with reference to the embodiments described hereinafter.

DETAILED DESCRIPTION OF EMBODIMENTS

Figure 1:
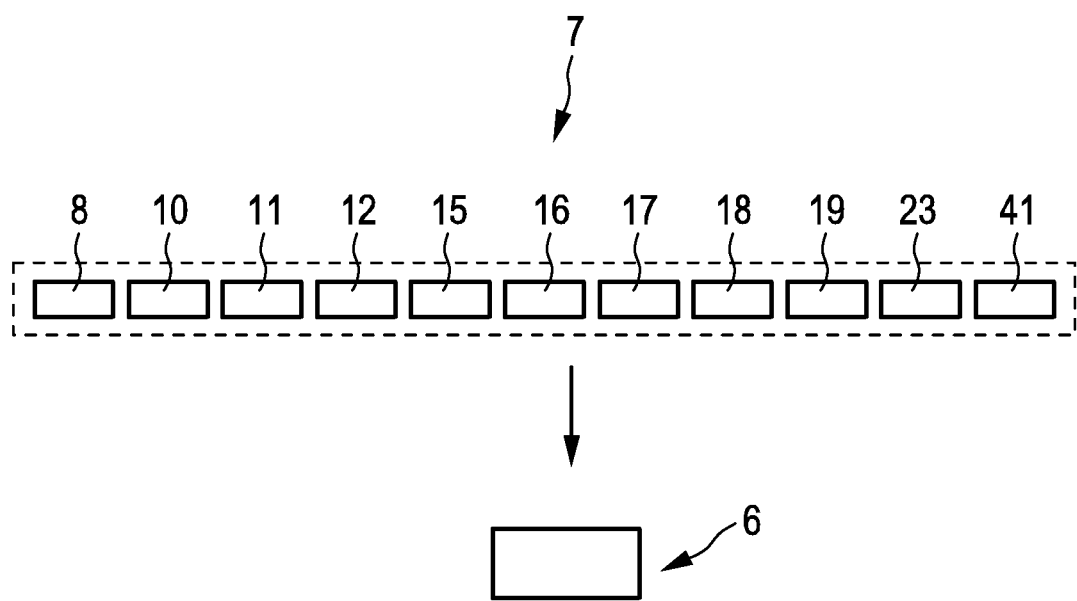
FIG. 1 shows schematically and exemplarily a fabrication apparatus for fabricating a layer structure comprising at least a first patterned layer and a second patterned layer on a substrate.
Figure 2:
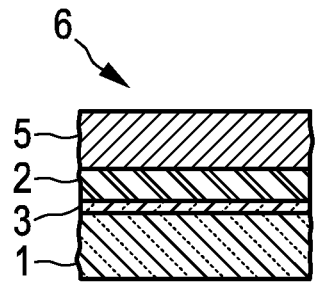
FIGS. 2 to 9 show the layer structure after different processing steps performed by the fabrication apparatus.

FIG. 1 shows schematically and exemplarily an embodiment of a fabrication apparatus 7 for fabricating a layer structure comprising at least a first patterned layer and a second patterned layer on a substrate. The fabrication apparatus 7 is adapted to process a layer structure 6 with a first unpatterned layer 2 and a second unpatterned layer 5 as schematically and exemplarily shown in more detail in FIG. 2. The first unpatterned layer 2 is located between the substrate 1 and the second unpatterned layer 5. The first unpatterned layer 2 includes a first conductive material and the second unpatterned layer 5 includes a second conductive material. Preferentially, at least one of the first conductive material and the second conductive material is transparent, in particular, to visible light. In particular, the second layer is a metallization made from, for example, MoNb/AlNd/MoNb coatings. The first layer is, in this embodiment, an ITO layer provided on the substrate 1 being a glass plate covered with a barrier layer 3 being, for example, a $SiO_2$ layer, a SiN layer or another layer. The barrier layer 3 may have a thickness in the range of 15 to 30 nm.

The ITO coating has, for example, a thickness of 150 nm and the metal coating, i.e. the second layer, may have a thickness of about 550 nm.

Figure 3:
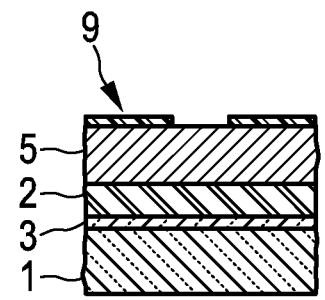
Figure 4:
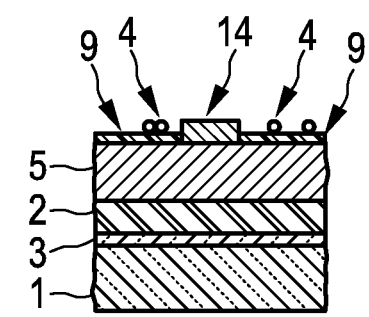

The provided layer structure 6 has preferentially coarsely been cleaned, wherein after this optional cleaning step a protective material application unit 8 applies a protective material 9 at least on parts of the unpatterned second layer 5 for protecting at least the parts of the unpatterned second layer 5. In particular, the unpatterned second layer 5 is to be patterned to comprise second layer material, in this embodiment, metal, in first regions and not in second regions. The protective material application unit 8 is adapted to apply a patterned protective layer on the unpatterned second layer 5 such that the protective material 9 is located in the second regions. The fabrication apparatus 7 further comprises an etch mask application unit 10 for applying a patterned etch mask 14 on the unpatterned second layer, wherein, in this embodiment, the etch mask application unit 10 is adapted to apply the etch mask 14 on the unpatterned second layer 5 such that etch mask material is located in the first regions. FIG. 3 shows the layer structure 6 after the protective material 9 has been applied on the second unpatterned layer 5, and FIG. 4 shows the layer structure 6 after also the etch mask 14 has been applied on the second unpatterned layer 5. Since the application of the etch mask material may not be perfect, unwanted parts 4 of the etch mask material may be located on the protective material 9. It should be noted that parts of the second layer 5 and the etch mask and/or the protective material are arranged in the same region, if they are arranged in different depths within the layer structure but in the same in-plane position with respect to the planes defined by the layers of the layer structure 6.

The protective material application unit 8 is adapted to apply the protective material 9 by printing. In this embodiment, the protective material is hot wax that becomes liquid at about 90° C. In particular, the protective material application unit 8 is preferentially adapted to use hot wax ink and heated inkjet technology provided, for example, by the company Océ Technologies B.V. The etch mask application unit 10 is adapted to print the etch mask 14 on the unpatterned second layer 5. The etch mask application unit 10 can comprise inkjet technology using a Dimatix Printer DMP 2800 and a Dimatix Material Cartridge DMC 11610 and AZ1518-PGMEA as ink.

The fabrication apparatus 7 further comprises a soft bake unit 11 for soft baking the etch mask. In particular, the soft bake unit 11 can comprise a baking device like a convection oven or a vacuum hot plate. For example, the soft bake unit 11 can comprise a convection oven which soft bakes the etch mask for 5 min at 130° C. Soft baking by using a vacuum hot plate allows a faster soft baking.

Figure 5:
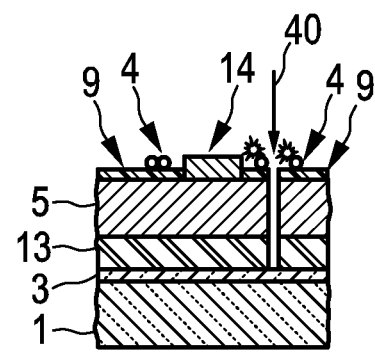

The fabrication apparatus 7 further comprises an ablation unit 12 for ablating the unpatterned first layer 2 through the second layer 5 such that a first patterned layer 13 is generated. Preferentially, the ablation unit 12 comprises a laser for performing laser ablation through the unpatterned second layer 5. In this embodiment, the laser is a solid state laser operating at 355 nm having a Q-switch mode for equal pulse energy. The beam profile is Gauss-shaped. The laser ablation can be performed by, for example, 1 W. FIG. 5 shows schematically and exemplarily the layer structure 6 after the first layer has been patterned. Since, in this embodiment the laser ablation is performed through the second layer 5 and, thus, through the protective material 9 also the second layer 5 and the protective material 9 are ablated by the ablation procedure. In FIG. 5, the laser is indicated by the arrow 40.

Figure 6:
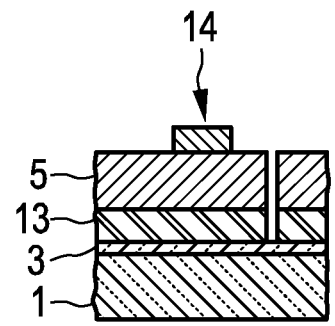

The fabrication apparatus 7 further comprises a protective material removing unit 15 for removing the protective material 9. The protective material removing unit 15 is adapted to use heated water for removing the protective material 9. In this embodiment, the protective material 9 is hot wax being removed, i.e. being stripped, by cleaning in hot demineralised-water for several cycles. The protective material removing unit 15 can comprise a cascade of rinsing stations, wherein from rinsing station to rinsing station the protective material is removed more and more. The hot demineralised-water has preferentially a temperature being larger than 95° C. FIG. 6 shows schematically and exemplarily the layer structure 6 after the protective material 9 has been removed.

After the protective material 9 has been removed, an etching unit 16 etches the second unpatterned layer 5 for forming the second patterned layer 17. In this embodiment, the etching unit 16 applies spray-etching of MoNb/AlNd/MoNb in a phosphoric acid etchant (PES). For example, a PES can be used having 65.4 mass percent $H_3PO_4$, 13.7 mass percent $Ch_3COOH$, 6.5 mass percent $HNO_3$ and 14.4 mass percent $H_2O$. The PES can also comprise 76.7 mass percent $H_3PO_4$, 8.5 mass percent $CH_3COOH$, 1.2 mass percent $HNO_3$ and 13.6 mass percent $H_2O$ or other combinations.

Figure 7:
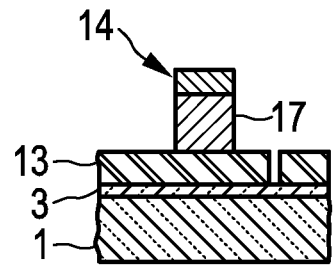

Before etching the second unpatterned layer 5 the soft bake unit 11 can be used for optionally performing a short baking step above 135° C., if needed, to remove potentially remaining monolayers of the hot wax. FIG. 7 shows schematically and exemplarily the layer structure after the second layer has been etched.

Figure 8:
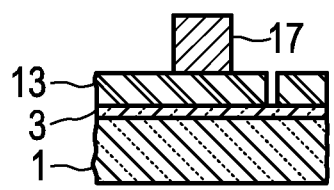

The fabrication apparatus 7 further comprises an etch mask removing unit 18 for removing the etch mask 14, after the second layer has been etched. For example, the etch mask removing unit 18 can be adapted to perform a spray-stripping of the etch mask being, in this embodiment, AZ1518 resist. The etch mask removing unit 18 is preferentially further adapted to clean the etched second layer in distilled water followed by a drying procedure like an air knife procedure or an IR oven procedure. The resulting layer structure 6 with the patterned second layer 17 is schematically and exemplarily shown in FIG. 8.

Figure 9:
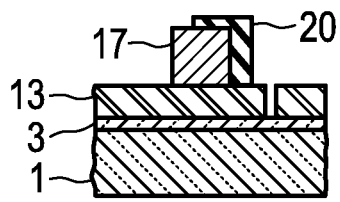

The fabrication apparatus further comprises an insulating material application unit 19 for applying insulating material 20 on the patterned second layer 17, after the etch mask has been removed. The insulating material is then hard baked by a hard bake unit 23. In particular, the insulating material is preferentially applied on edges of the etched second layer 17 to prevent high current densities. The insulating material application unit 19 is preferentially adapted to apply the insulating material 20 by inkjet printing. The insulating material is preferentially a resist. Also for printing the insulation material inkjet technology using a Dimatix Printer DMP 2800 and a Dimatix Material Cartridge DMC 11610 and AZ1518-PGMEA as ink can be used. The resulting layer structure with the insulating material 20 is schematically and exemplarily shown in FIG. 9.

It should be noted that FIGS. 2 to 9 only show a part of the layer structure just for clarifying the different fabrication steps. Thus, the patterned layers can have more elements then the number of elements shown in these figures.

The fabrication apparatus can further comprise an electrical device producing unit 41 for producing an electrical device comprising the fabricated layer structure. In this embodiment, an OLED is produced, which is schematically and exemplarily shown in FIG. 10.

Figure 10:
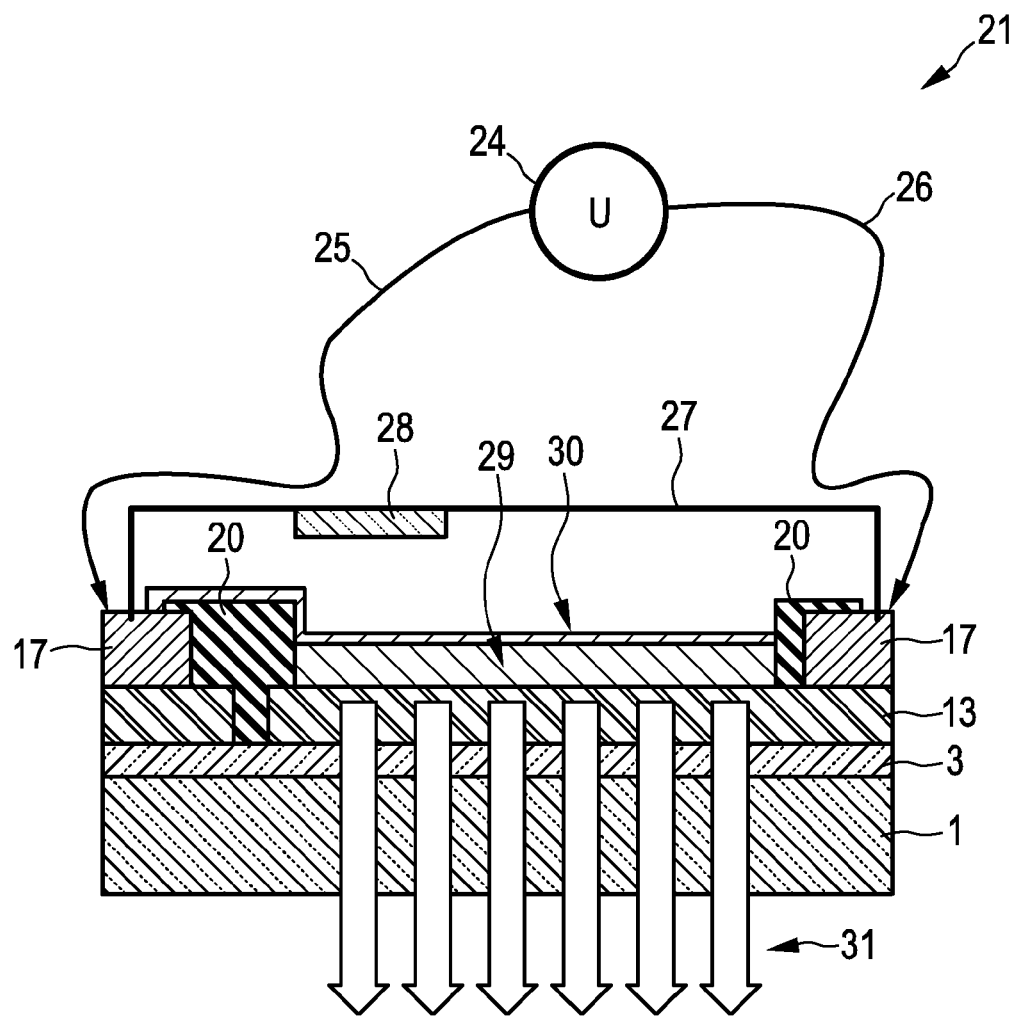
FIG. 10 shows schematically and exemplarily an OLED comprising the layer structure fabricated by the fabrication apparatus.

The OLED 21 shown in FIG. 10 comprises the substrate 1 with the barrier layer 3, the patterned first layer 13, the patterned second layer 17 and the patterned insulation 20 produced as described above with reference to FIGS. 2 to 9. Moreover, a conductive layer 30 being, for example, a metal layer, a casing 27 being, for example, a glass casing and a getter 28 have been provided as moisture protection. Moreover, before applying the conductive layer 30 an organic layer structure 29 is applied on the patterned second layer 13 such that the organic layer stack 29 is sandwiched between the conductive layer 30 and the second patterned layer 13. The conductive layer 30 and the part of the patterned second layer 13 adjacent to the organic layer 29 form a cathode and an anode, respectively, which are electrically connected with a voltage source 24 via electrical connections 25, 26 for generating electrical current within the organic layer 29. By injecting an electric current into the organic layer stack 29 light 31 is produced in the organic layer stack 29 in a known way.

Figure 11:
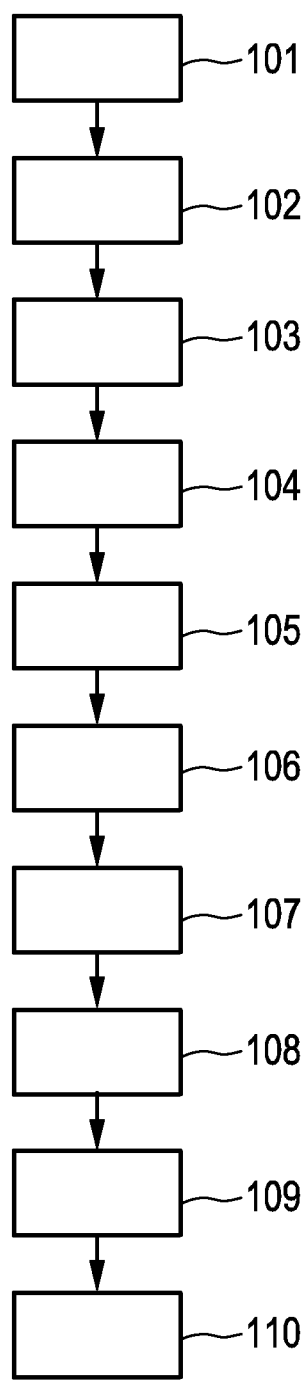
FIG. 11 shows a flowchart exemplarily illustrating an embodiment of a fabrication method for fabricating a layer structure comprising at least a first patterned layer and a second patterned layer on a substrate.

In the following an embodiment of a fabrication method for fabricating a layer structure will exemplarily be described with reference to a flowchart shown in FIG. 11.

After having provided a layer structure with a first unpatterned layer and a second unpatterned layer on a substrate, wherein the first unpatterned layer is located between the substrate and the second unpatterned layer, in step 101 a protective material is applied at least on parts of the unpatterned second layer for protecting at least the parts of the unpatterned second layer. In particular, a layer structure is provided, wherein the first unpatterned layer is a conductive layer like an ITO layer coated on a barrier layer on a glass plate being the substrate and the second unpatterned layer is a metallization layer. The protective material is preferentially hot wax, which is provided on parts of the unpatterned second layer, which should not be contaminated by debris, which may be caused during ablating the first unpatterned layer, or by other unwanted particles.

In step 102, an etch mask is applied on the unpatterned second layer. This application of the etch mask is preferentially performed by using inkjet technology for printing the etch mask, whereupon a soft bake is applied for, for example, 15 min at 85° C. The soft baking procedure is performed in step 103.

In step 104, the unpatterned first layer is ablated through the second layer such that the first patterned layer is generated. In particular, a laser ablation of the ITO coating is applied through the metallization being the unpatterned second layer by using, for example, a solid state laser operating at 355 nm having a Q-switch mode for equal pulse energy.

In step 105, the protective material is removed. In this embodiment, the hot wax ink is cleaned in hot demineralised-water for several cycles, wherein the water has a temperature being larger than 95° C. If, in an embodiment, the protective material vaporizes at a temperature being smaller than the hard bake temperature of the etch mask, optionally potentially remaining monolayers of the protective material can be removed by performing a short baking at a temperature being equal to or larger than the temperature at which the protective material vaporizes and smaller than the temperature at which the etch mask can be hard baked. In step 106, the second unpatterned layer is etched for forming the second patterned layer.

In step 107, the etch mask is removed and, in step 108, insulating material is applied on the patterned second layer, in particular, on edges of the etched metallization forming the patterned second layer. In step 109, the insulating material is hard baked. In step 110, the resulting layer structure can be used for producing an OLED. In particular, an organic layer stack 29 and a further conductive material 30 can be applied on the layer structure as described above with reference to FIG. 10. Then, the layer structure can be provided with a casing 27 and a getter 28, and connected with a voltage source 24 as described above with reference to FIG. 10.

Substrates for OLED fabrication are often made from display glass with a transparent conductive anode coating and a metallization on top. Both, anode and metal layer need to be patterned to realize electrically insulating regions and in case of the metal also to create a window for the light extraction. While in OLED displays or small devices the metal is usually only forming a frame of the device, in larger devices due to the limited conductivity of the anode material additional fine metal structures supporting the lateral current distribution have to be applied to realize homogeneously emitting devices.

Known fabrication processes most often are based on starting with full area coatings of anode and metallization layers and a subsequent patterning process which is usually done by photolithography. This makes substrates, especially for small product series, an expensive component since photolithography has been developed for very high accuracy and fine pattern resolution which makes it an expensive process. Also since a costly mask is needed for exposure and development steps for each new design (and after a certain number of exposed substrates) this process has to be improved to realize competitive fabrication costs for OLED lighting modules.

Motivated by this situation several institutions have been researching the possibility to reduce patterning costs for substrates and using other processes. One promising process flow as it keeps the risks low is, for example, a flow similar to the photolithography but instead of patterning the metal by photolithography, patterning is done by printing an etch mask instead of exposure and development and the patterning of the anode material (here only very limited amount of material has to be removed) is replaced by laser ablation. Besides a significant cost down this process flow has the advantage of providing fast switching times from one design to another.

While a process flow as described in the previous paragraph delivers a significant reduction of costs printing a mask instead of doing a full area application of a photo-sensitive lacquer with a subsequent exposure step through an expensive mask and a development of the lacquer it also brings some risks. The origin of those risks is different for different printing techniques but the result is basically the same. If during application of the etch mask, ink is deposited by mistake in areas were a full etching of the metal (removal) is wanted/needed, this ink "droplet/satellite" causes remainders of metal in critical areas. More precise, if during printing the etch mask a droplet of ink is deposited into the area for deposition of organic, this results in a metal island which in turn causes either a direct short to the cathode by forming an electrical contact or it creates a weak spot inside the device. The weak spot is formed due to either shadowing effects during deposition of the organic and cathode layers forming inhomogeneities of film thicknesses or by locally reducing the distance between anode and cathode. Both effects result in a local increase of electrical field strength followed by higher flow of current, followed by a local increase of temperature which correlates to a decrease in electrical resistance of the organic and that again causes more current to flow. Finally also that leads to a shorting device.

Besides risks from printing also the laser ablation of anode material causes particles, which may in principle lead to the same effect, either shorts, an increase in dark currents and/or local weak spots. That means, debris has to be avoided. Since that even with a dedicated exhaust system—cannot be totally realized, one has to take care of the debris. Cleaning would be a reasonable approach, however, depending on the laser and parameters used as well as on the material to be removed those debris particles may be very small with a high adherence to the surface, i.e. cleaning is complicated, especially since the surface of the anode is very sensitive to damage/alterations.

Summed up, if this process flow should be used with high yield, one has to take care of preventing ink droplets in critical areas as well as to prevent debris on the anode-organic interface.

Thus, the fabrication apparatus and method described above with reference to FIGS. 1 to 9 are adapted to perform laser ablation for anode patterning prior to etching. In that way, debris would—if generated—lie on top of the metal and can be removed by either a more aggressive cleaning as it would be possible/allowed on the anode itself or by introducing a short etching step, etching the debris away before etching the metal which suits as a protection of the anode in this phase of the process. However, this way the ablation has to be done through the metal, which may cause melting of the metal with subsequent ablation of the anode material underneath. As a result, a mixture of molten metal and debris gets extruded and then re-deposits onto the surface. Now, etching of debris becomes a lot more complicated since it is embedded into solidified droplets of metal. An option would be to choose an etchant, which attacks both layer 2 and layer 5 materials and as such inherits a risk of etching the interface between layer 2 and layer 5, which should be avoided. Usually layer 5 is etched with an etchant that does not attack the material of layer 2 and vice versa. Although the effect of metal melting during ablation might be reduced by choosing expensive laser techniques or special processing a complete prevention of debris seems hardly likely. The same risks are valid for the printing. Optimizing printing parameters as well as choosing appropriate print heads (mentioning ink jet just as an example of printing in general) will reduce probabilities to deposit satellites in critical areas but total prevention seems unlikely.

Therefore, fabrication apparatus and method described above with reference to FIGS. 1 to 9 apply a protective film, i.e. the protective material. This protective film has to be easy applicable as well as it must be completely removable, wherein the improved process flow consists preferentially of first application of this protection in all critical areas, then printing the etch mask followed by laser ablation through the metal. After that, the protection will be removed, carrying the potentially deposited debris/metal drops as well as ink satellites away, revealing a bare metal surface, which will be exposed to etching as a next step. After etching, the printed etch mask will be stripped conventionally and an insulator will be applied (for example by printing as well) in regions where needed.

As mentioned the total removal of the protection is crucial as can easily be understood. Remainders would lead to the same effect as mistakenly printed etch mask material, which shall be prevented: metal islands after etching. As such a material is to be used that can withstand the soft bake of the printed etch mask and does not stick to the substrate afterwards. Also it should be removed without removing the printed etch mask as well. One group of materials that can be used for such an approach is the above mentioned hot wax ink which is basically a wax which is heated above melting point inside a print head. After printing it directly crystallizes and forms a solid layer. Such an ink as well as the printing technology has been developed by Océ Technologies B.V. for example. The advantage of this material is that it remains solid below a given temperature and can be washed away with water of higher temperature than that. Even higher temperature vaporizes possibly remaining monolayers of the material. That makes it a perfect material for this lacquer. Application can be realized by ink jet printing, i.e. exactly positioned where it is needed. The printed etch mask can be soft baked below the temperature of above 95° C. were the wax begins to melt again. After drying the etch mask it can be removed by pure water not affecting the etch mask. If the protective material vaporizes below the hard bake temperature of the etch mask, in an optional heating step potential remainders can be evaporated. Doing that can protect the surface of the layer structure from debris as well as from ink satellites.

In an embodiment, before removing the protective material, an optional debris etching step can be performed, wherein after the protective material has been removed, the etching step described above with reference to FIG. 7 can be performed. The debris etching step is preferentially performed with an etching solution, which etches first layer debris and second layer debris, but substantially not the protective material, in order to remove debris from the protective material 9 at least partly by using the debris etching. In contrast, the etching step described above with reference to FIG. 7 uses an etch solution, which etches the second layer 5, but not the first layer 13.

Although in the above described embodiments the second layer comprises preferentially a metallization made from MoNb/AlNd/MoNb coatings, the second layer can also comprise another conductive material, in particular, another coating.

Although in the above described embodiments the first layer is preferentially ITO coated on a glass plate being the substrate, the first layer can also comprise another conductive material, for example, those also being transparent and the substrate can also be made of another material like a plastics material.

Although in the above described embodiments the fabrication apparatus is adapted to fabricate an OLED, the fabrication apparatus can also be adapted to just fabricate a layer structure comprising a patterned first layer and a patterned second layer on a substrate. In particular, the fabrication apparatus can be adapted to just fabricate the layer structure indicated by FIG. 9. The fabricated layer structure can then be used as a basis for producing an OLED or another electrical device.

Although in the above described embodiments the provided layer structure comprises an unpatterned first layer and an unpatterned second layer, wherein the fabrication apparatus is adapted to pattern the first and second layers, in another embodiment the provided layer structure can, for example, comprise the first unpatterned layer, without comprising the second unpatterned layer, and the fabrication apparatus can be adapted to pattern the first layer, or the provided layer structure can comprise first and second unpatterned layers, wherein the fabrication apparatus can be adapted to pattern the first layer and not the second layer.

Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality.

A single unit or device may fulfill the functions of several items recited in the claims. The mere fact that certain measures are recited in mutually different dependent claims does not indicate that a combination of these measures cannot be used to advantage.

Processing steps like the application of the protective material and the etch mask, the soft and hard baking steps, the stripping of the protective material and the etch mask et cetera performed by using one or several units or devices can be performed by any other number of units or devices. The control of the fabrication apparatus in accordance with the fabrication method can be implemented as program code means of a computer program and/or as dedicated hardware.

A computer program may be stored/distributed on a suitable medium, such as an optical storage medium or a solid-state medium, supplied together with or as part of other hardware, but may also be distributed in other forms, such as via the Internet or other wired or wireless telecommunication systems.

Any reference signs in the claims should not be construed as limiting the scope.

The invention relates to a fabrication apparatus for fabricating a layer structure comprising at least a patterned first layer on a substrate, wherein a layer structure with an unpatterned first layer is provided on the substrate. A protective material application unit applies protective material at least on parts of the provided layer structure for protecting at least the parts of the provided layer structure, an ablation unit ablates the unpatterned first layer through the protective material such that the patterned first layer is generated, and the protective material removing unit removes the protective material. This allows fabricating a layer structure for, for example, an OLED without necessarily using a technically complex and costly photolithography process. Moreover, ablation debris can be removed with removing the protective material, thereby reducing the probability of unwanted effects like unwanted shortcuts in the OLED caused by unwanted debris.

The invention claimed is:

1. A fabrication apparatus for fabricating a layer structure comprising at least a patterned first layer and a patterned second layer on a substrate, wherein a layer structure with an unpatterned first layer and an unpatterned second layer are provided on the substrate, the unpatterned first layer being located between the substrate and the unpatterned second layer, the fabrication apparatus comprising:
   a protective material application unit for applying protective material at least on parts of the provided layer structure for protecting at least the parts of the provided layer structure,
   an etch mask application unit for applying a patterned etch mask on the unpatterned second layer after the protective material has been applied,
   an etching unit for etching the unpatterned second layer for forming the patterned second layer,
   an ablation unit for ablating the unpatterned first layer through the protective material such that the patterned first layer is generated, and
   a protective material removing unit for removing the protective material.

2. The fabrication apparatus as defined in claim 1, wherein the unpatterned second layer is to be patterned to comprise second layer material in first regions and not in second regions on the substrate, and wherein the protective material application unit is adapted to apply a patterned protective layer on the unpatterned second layer such that protective material is located in the second regions.

3. The fabrication apparatus as defined in claim 2, wherein the etch mask application unit is adapted to apply the etch mask on the unpatterned second layer such that etch mask material is located in the first regions.

4. The fabrication apparatus as defined in claim 1, wherein the protective material application unit is adapted to apply the protective material by printing.

5. The fabrication apparatus as defined in claim 1, wherein the protective material application unit is adapted to apply wax as the protective material.

6. The fabrication apparatus as defined in claim 1, wherein the etch mask application unit is adapted to print the etch mask on the unpatterned second layer.

7. The fabrication apparatus as defined in claim 1, wherein the ablation unit comprises a laser for performing a laser ablation through the protective material.

8. The fabrication apparatus as defined in claim 1, wherein the protective material removing unit is adapted to use heated water for removing the protective material.

9. The fabrication apparatus as defined in claim 1, wherein the protective material removing unit is adapted to heat the layer structure to an evaporation temperature of the protective material for removing the protective material by evaporation.

10. The fabrication apparatus as defined in claim 1, wherein the fabrication apparatus further comprises an insulating material application unit for applying insulating material on the layer structure.

11. The fabrication apparatus as defined in claim 1, wherein the fabrication apparatus further comprises an electrical device producing unit for producing an electrical device comprising the layer structure with at least the patterned first layer.

12. An electrical device comprising a layer structure including at least a patterned first layer on a substrate, wherein the layer structure is fabricatable by the fabrication apparatus as defined in claim 1.

13. A fabrication method for fabricating a layer structure comprising at least a patterned first layer and a patterned second layer on a substrate, wherein a layer structure with an unpatterned first layer and an unpatterned second layer are provided on the substrate, the unpatterned first layer being located between the substrate and the unpatterned second layer the fabrication method comprising:
   applying protective material at least on parts of the provided layer structure,
   applying a patterned etch mask on the unpatterned second layer after the protective material has been applied,
   etching the unpatterned second layer for forming the patterned second layer,
   ablating the unpatterned first layer through the protective material such that the first patterned layer is generated,
   removing the protective material.

14. A non-transitory computer readable storage medium for fabricating a layer structure, the layer structure comprising at least a patterned first layer and a patterned second layer on a substrate, wherein a layer structure with an unpatterned first layer and an unpatterned second layer are provided on the substrate, the non-transitory computer readable storage medium comprising a set of instruction that are executable by a fabrication apparatus as defined in claim 1 to carry out the steps of
   applying protective material at least on parts of the provided layer structure,
   applying a patterned etch mask on the unpatterned second layer after the protective material has been applied,
   etching the unpatterned second layer for forming the patterned second layer
   ablating the unpatterned first layer through the protective material such that the first patterned layer is generated,
   removing the protective material.

* * * * *